(12) United States Patent
Liu et al.

(10) Patent No.: US 6,465,815 B2
(45) Date of Patent: Oct. 15, 2002

(54) HIGH-BREAKDOWN VOLTAGE HETEROSTRUCTURE FIELD-EFFECT TRANSISTOR FOR HIGH TEMPERATURE OPERATIONS

(75) Inventors: Wen-Chau Liu, Tainan (TW); Jung-Hui Tsai, Kaohsiung (TW); Wen-Lung Chang, Tainan (TW); Kuo-Hui Yu, Tainan (TW); Kun-Wei Lin, Tainan (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/751,012

(22) Filed: Dec. 29, 2000

(65) Prior Publication Data

US 2002/0030202 A1 Mar. 14, 2002

(30) Foreign Application Priority Data

Jun. 14, 2000 (TW) ........................................ 89111655 A

(51) Int. Cl.$^7$ ............................................. H01L 29/778
(52) U.S. Cl. ......................................... 257/194; 257/192
(58) Field of Search .................................... 257/192, 194

(56) References Cited

U.S. PATENT DOCUMENTS 5,786,244 A * 7/1998 Chang .......................... 257/194

OTHER PUBLICATIONS

J.S. Su, W.C. Hsu, W. Lin, and S. Y. Jain, "High–Breakdown Characteristics of the InP–Based Heterostructure Field–Effect Transistor with $IN_{0.34}Al_{0.66}As_{0.85}Sb_{0.15}$ Schottky Layer," IEEE Electron Device Letters, vol. 19, No. 6, pp. 195–197, Jun. 1998.

W. L. Chang, H. J. Pan, W. C. Wang, K. B. Thei, S. Y. Cheng, W. S. Lour, and W. C. Liu, "Temperature–Dependent Characteristics of the Inverted Delta–Doped V–Shaped InGaP/$In_xAS/Ga_{1-x}As/GaAs$ Pseudomorphic Transistors" Jpn. J. Appl. Phys., vol. 38, pp. L1385–L1387, part 2, No. 12A, Dec. 1, 1999.

* cited by examiner

Primary Examiner—Jerome Jackson
(74) Attorney, Agent, or Firm—Jackson Walker L.L.P.

(57) ABSTRACT

The invention relates to a high-breakdown voltage heterostructure field-effect transistor (FET), which can be used under a high temperature condition. The FET device from bottom upward in succession includes a semiconductor substrate, a buffer layer, a delta-doped sheet, an undoped layer, a sub-channel layer, an active channel layer, a gate layer, and an ohmic contact layer.

26 Claims, 7 Drawing Sheets

HIGH-BREAKDOWN VOLTAGE HETEROSTRUCTURE FIELD-EFFECT TRANSISTOR FOR HIGH TEMPERATURE OPERATIONS

FIELD OF THE INVENTION

This invention is related to a high-breakdown voltage heterostructure field-effect transistor with high temperature operation ability.

BACKGROUND OF THE INVENTION

In general, attributed to harsh thermal environment, transistors operation suffer from some disadvantages such as (1) the increase of gate leakage current, (2) the reduction of effective gate Schottky barrier, (3) the reduction of breakdown voltage, (4) the increase of threshold voltage, and (5) the decrease of transconductance, etc. Further, the device scale of IC and the space between electrodes are expected to gradually decrease. Consequently, the fields between gates and drains of field effect transistors and between base and collector of the bipolar transistors could bring about breakdown thereof.

Recently, due to the improvements of semiconductor technique and the development of new microwave materials, many methods and structures have been proposed by researchers to enhance the breakdown voltage of FET devices, and several of them have been successfully utilized for space exploration, satellite, automatic control system, navigation, radar, and subterranean exploration applications. Among them, devices fabricated with (1) SiC, (2) GaN, (3) AlAs, (4) AlGaAs, and (5) diamond show excellent high-temperature and high-breakdown characteristics. It is clear that there is still a great need in the semiconductor industry to develop a device having high-breakdown voltage and high-temperature endurable ability.

SUMMARY OF THE INVENTION

The present invention provides a high-breakdown voltage heterostructure field-effect transistor for high temperature operations. More particularly, the present invention provides a high-breakdown voltage heterostructure field-effect transistor comprising a GaInP/GaAs structure for high temperature operations.

A high-breakdown voltage heterostructure field-effect transistor constructed according to the present invention comprises:
  a semiconductor substrate;
  an undoped buffer layer formed on said substrate;
  a delta-doped sheet formed on said undoped buffer layer;
  an undoped layer formed on said delta-doped sheet;
  a sub-channel layer formed on said undoped layer;
  an active channel layer formed on said sub-channel layer;
  a gate layer formed on said active channel layer; and
  an ohmic contact layer formed on said gate layer, wherein said gate layer and said ohmic contact layer are so formed such that said active channel layer has exposed portions.

Preferably, said delta-doped sheet has a doping concentration ranging from $2 \times 10^{12}$ to $1 \times 10^{13}$ cm$^{-3}$.

Preferably, said substrate of the transistor of the present invention is a semi-insulating GaAs; said undoped buffer layer is an undoped GaAs having a thickness of 0.1–2.0 μm; said undoped layer formed on said delta-doped sheet is GaAs having a thickness of 50–100 Å; said sub-channel layer is $In_xGa_{1-x}As$ having a thickness of 100–200 Å, where x=0.05–0.25; said active channel layer is n-type GaAs having a thickness of 1500–3000 Å and an n-type dopant concentration of n=$1 \times 10^{17}$–$5 \times 10^{17}$ cm$^{-3}$; said ohmic contact layer is an n-type GaAs having a thickness of 200–3000 Å and an n-type dopant concentration of n=$1 \times 10^{18}$–$1 \times 10^{19}$ cm$^{-3}$; and said gate layer is p-type $Ga_{0.51}In_{0.49}P$ having a thickness of 80–120 Å and a p-type dopant concentration of p=$6 \times 10^{18}$–$1 \times 10^{19}$ cm$^{-3}$, p-type $Al_xGa_{1-x}As$ having a thickness of 80–120 Å and a p-type dopant concentration of p=$6 \times 10^{18}$–$1 \times 10^{19}$ cm$^{-3}$, where x=0.2–0.5, or $Al_{0.5}In_{0.5}P$ having a thickness of 80–120 Å and a p-type dopant concentration of p=$6 \times 10^{18}$–$1 \times 10^{19}$ cm$^{-3}$.

Preferably, said transistor of the present invention further comprises a gate electrode which forms an ohmic contact with said ohmic contact layer, and more preferably said gate electrode is Au.

Preferably, said transistor of the present invention further comprises a drain electrode and a source electrode on said exposed portions of said active channel layer, each of which forms an ohmic contact with said active channel layer, and more preferably said drain electrode and said source electrode are Au/Ga/Ni metal.

Alternatively, said substrate of said transistor of the present invention is a semi-insulating InP; said undoped buffer layer is InP having a thickness of 0.1–2.0 μm; said undoped layer formed on said delta-doped sheet is InP having a thickness of 50–100 Å; said sub-channel layer is $In_xGa_{1-x}As$ having a thickness of 100–200 Å, where x=0.45–0.6; said active channel layer is n-type $In_xGa_{1-x}As$ having a thickness of 1500–3000 Å and an n-type dopant concentration of n=$1 \times 10^{17}$–$5 \times 10^{17}$ cm$^{-3}$; said gate layer is p-type $Al_{0.48}In_{0.52}As$ having a thickness of 80–120 Å and a p-type dopant concentration of p=$6 \times 10^{18}$–$1 \times 10^{19}$ cm$^{-3}$; said ohmic contact layer is n-type $In_xGa_{1-x}As$ having a thickness of 200–3000 Å where x=0.45~0.6 and an n-type dopant concentration of n=$1 \times 10_{18}$–$1 \times 10^{19}$ cm$^{-3}$.

The structure of a device fabricated in accordance with one of the preferred embodiments of the present invention has the following features:

(1) A high barrier gate structure is formed with n$^+$-GaAs/p$^+$-$Ga_{0.51}In_{0.49}$P/n-GaAs heterojunction. It might be attributed to the existence of conduction band discontinuity value (ΔEc) of about 200 meV and valance band discontinuity value (ΔEv) of about 300 meV at $Ga_{0.51}In_{0.49}$P/GaAs heterojunction, electrons are confined within the channel layers, and thus excellent characteristics such as high transconductance, low leakage current, and high breakdown voltage are obtained;

(2) Due to the existence of GaAs/$In_{0.15}Ga_{0.85}$As/GaAs heterojunction, a conduction band of said sub-channel layer made of $In_{0.15}Ga_{0.85}$As epitaxial layer will form a quantum-well structure, so that the confinement effect of electrons and the linearity performance of the device are enhanced, (3) Further, an inverted delta-doped sheet is used to act as a carrier supplier to said sub-channel layer, so that the electron concentration and mobility can be enhanced, and the impurity scattering effect can be reduced.

When the structure of the present invention is adopted to fabricate a device, not only can improve the performance of the device, but also can enhance the high-temperature characteristics thereof. In view of above, the structure of the present invention is applicable to the fabrication of a field-effect transistor. Moreover, it has a great potential in the application of high-frequency microwave communication circuits, and in particular, the structure provides a promise for space exploration, satellite technology, automatic control system, navigation, radar, and the subterranean exploration applications.

BRIEF DESCRIPTION OF THEN DRAWS

The invention, as well as its many advantages, may be further understood by the following detailed description in conjunction with the following drawings in which.

Figure 1:
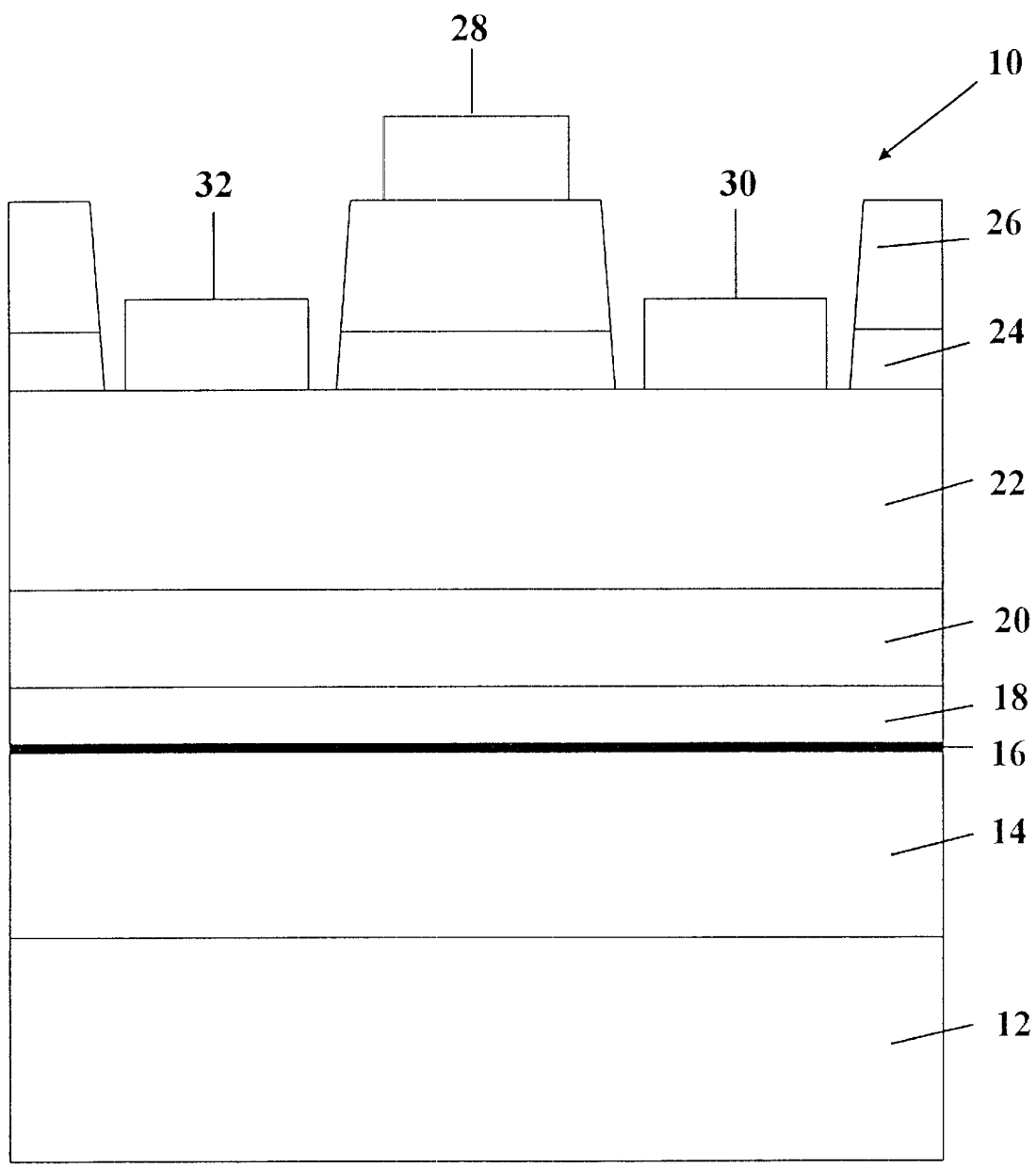
FIG. 1 is a cross-sectional view of a high-breakdown voltage heterostructure field-effect transistor for high temperature operations according to the present invention.
Figure 6:
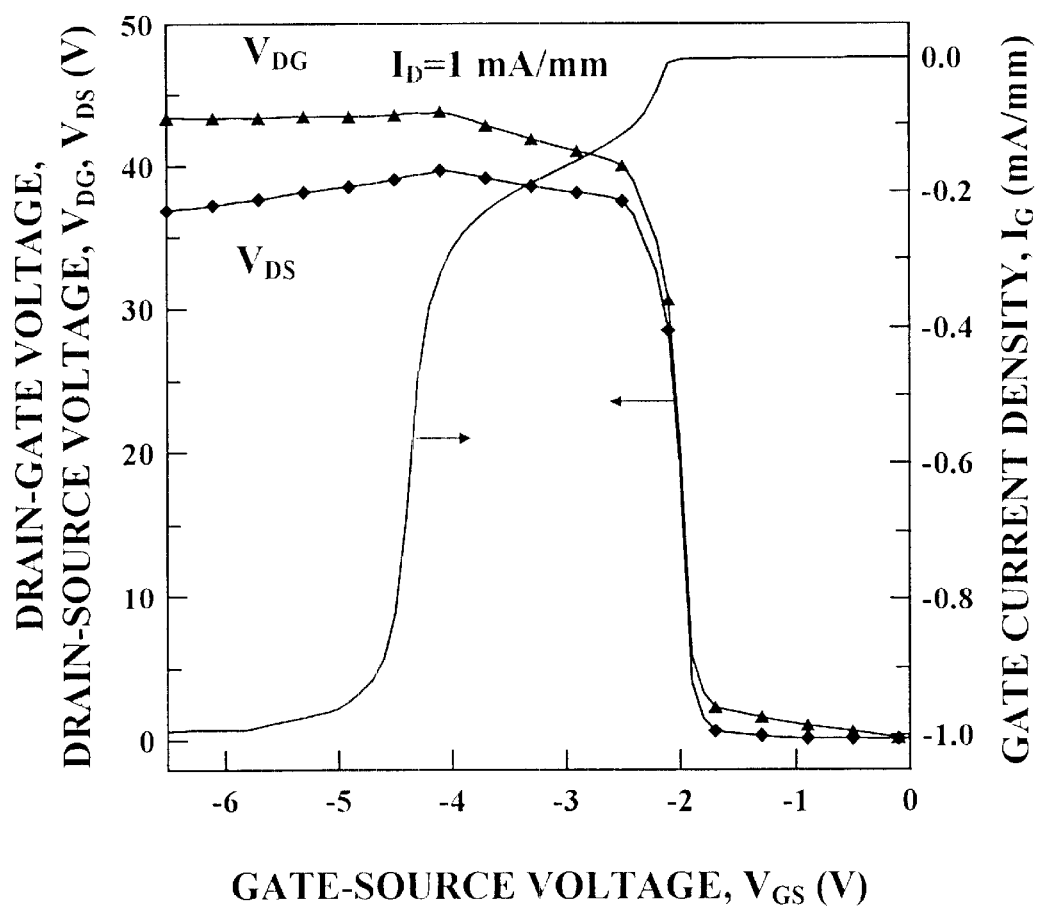
Figure 7:
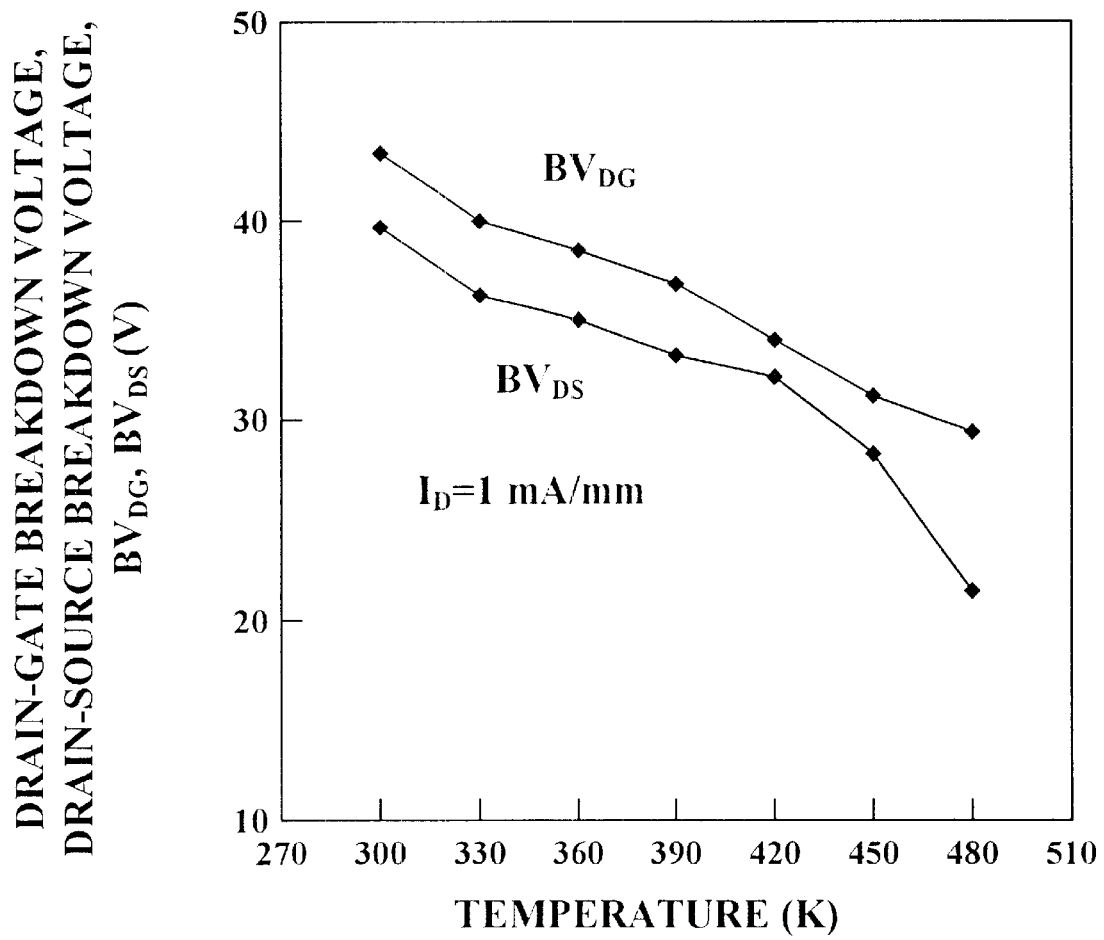

FIG. 6 shows the three-terminal off-state drain-gate and drain-source voltages, and gate current density ($I_G$) as a function of gate biased voltage of the high-breakdown voltage heterostructure field-effect transistor shown in FIG. 1, when the injection drain current is fixed at 1 mA/mm; and FIG. 7 shows the three-terminal off-state drain-gate and drain-source breakdown voltages of the high-breakdown voltage heterostructure field-effect transistor shown in FIG. 1 as a function of temperature;

DETAILED DESCRIPTION OF A PREFERRED EMBODIMENT

With respect to FIG. 1, a high-breakdown voltage heterostructure field-effect transistor 10 according to a preferred embodiment of the invention is shown, which comprises, a semi-insulating (SI) GaAs substrate 12; a 0.5 μm thick undoped GaAs buffer layer 14; a $\delta(n^+)=3\times10^{12}$ cm$^{-2}$ delta-doped sheet 16; a 50 Å thick undoped GaAs layer 18; a 100 Å thick undoped $In_{0.15}Ga_{0.85}As$ sub-channel layer 20; a 2000 Å thick GaAs active channel layer 22 (n=1×10$^{17}$ cm$^{-3}$); a 100 Å thick $Ga_{0.51}In_{0.49}P$ gate layer 24 (p$^+$=8×10$^{18}$ cm$^{-3}$); and a 200 Å thick GaAs ohmic contact layer 26 (n$^+$=6×10$^{18}$ cm$^{-3}$). Drain 30 and source 32 were formed by alloy evaporating Au/Ge/Ni on two exposed portions of the n-GaAs active channel layer 22, isolating the evaporated alloys and thermally treating the isolated alloys to form ohmic contacts. Finally, a high-barrier gate 28 was formed by evaporating Au metal on a portion of the n$^+$-GaAs ohmic contact layer 26 which separates the two exposed portions of the n-GaAs active channel layer 22.

Figure 2:
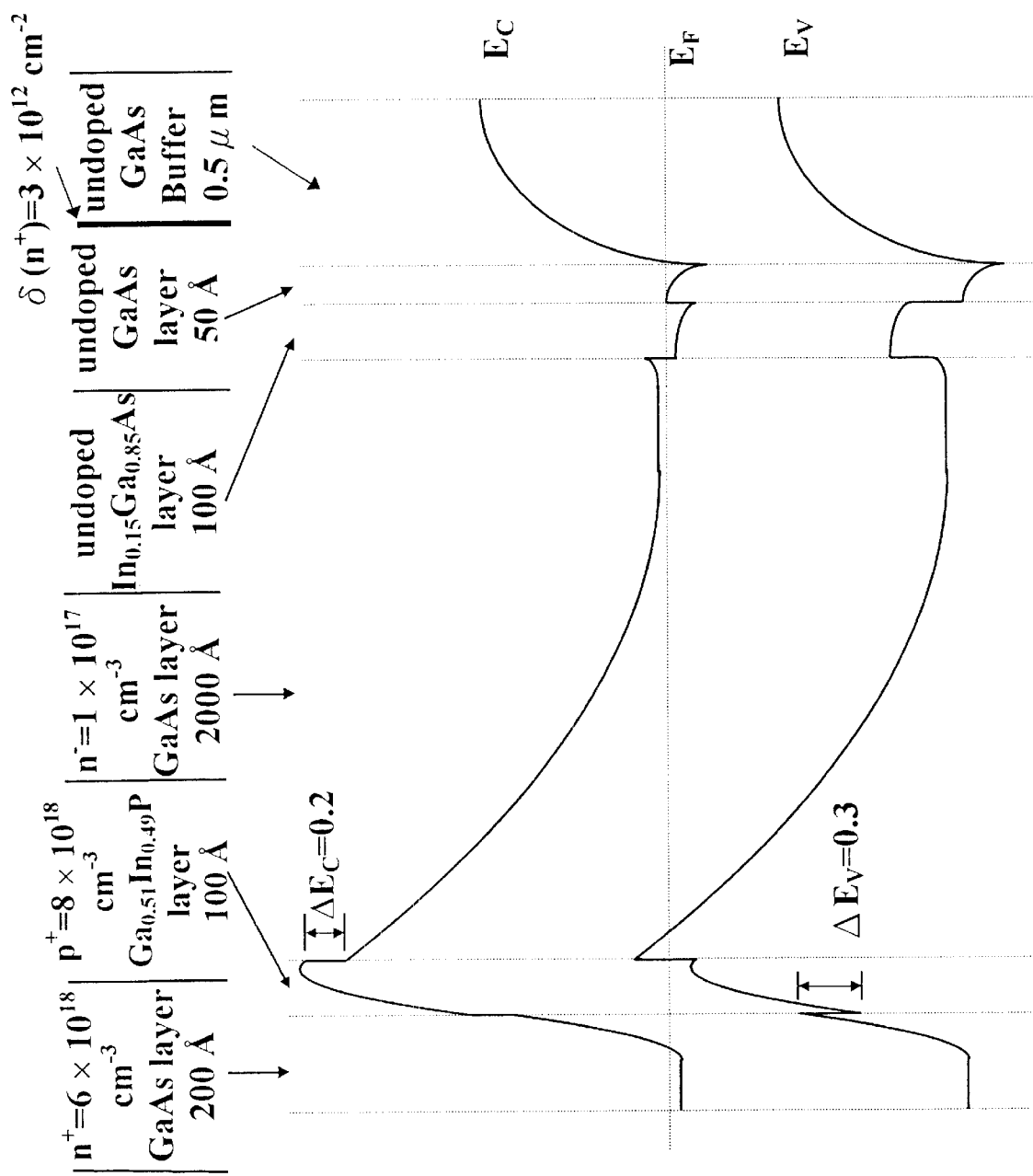
FIG. 2 is a band diagram of the high-breakdown voltage heterostructure field-effect transistor shown in FIG. 1.

FIG. 2 illustrates the band diagram of the transistor 10. Ec, $E_F$, and Ev are the conduction band, Fermi level, and valance band, respectively. Apparently, due to the existence of conduction band discontinuity value (ΔEc) of about 200 meV at $Ga_{0.51}In_{0.49}P$/GaAs heterojunction, electrons are confined effectively within the channel layers. Thus, good device characteristics, e.g. high transconductance and low gate leakage current, are obtained. On the other hand, the valance band discontinuity ΔEc about of 300 meV can prevent holes, generated by impact ionization at high drain-source voltage, injecting toward the gate electrode. Thus, the leakage current is suppressed and gate-drain breakdown voltage is increased. Further, the sub-channel layer 20 was an inverted delta-doped $In_{0.15}Ga_{0.85}As$ epitaxial layer, and GaAs/$In_{0.15}Ga_{0.085}As$/GaAs heterojunction was used, so that said sub-channel layer 20 will form a quantum-well structure, and thus the confinement effect of electrons is enhanced. Thereby, the device exhibiting a high electron concentration and mobility, and a large gate voltage swing for high transconductance operations.

Figure 3:
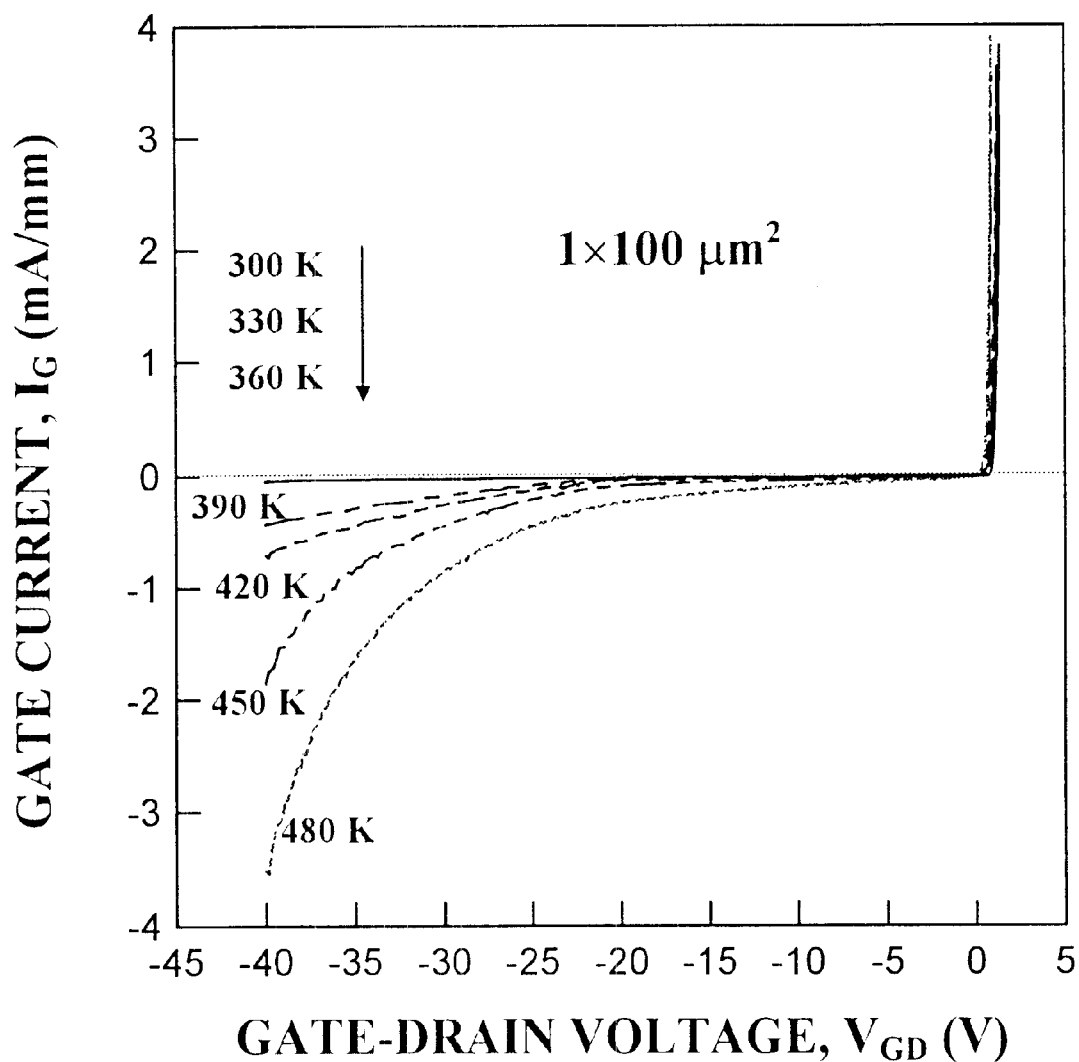
FIG. 3 shows the two-terminal gate current-voltage characteristics of the high-breakdown voltage heterostructure field-effect transistor shown in FIG. 1 under different temperatures.

FIG. 3 shows the two-terminal gate-drain I–V characteristics of the transistor 10. The gate dimension is 1×100 μm$^2$. As the applied gate-drain voltage ($V_{GD}$) is 40 V, the gate leakage current values are 37, 41, 51, 430, 720 μA/mm, 1.8, and 3.5 mA/mm at 300, 330, 360, 390, 420, 450, and 480 K, respectively. Further, as the gate current ($I_G$) is 1 mA/mm, the corresponding gate turn-on voltages are 1.2, 1.13, 1.05, 0.98, 0.87, 0.8, and 0.7 V, respectively. Besides, the breakdown voltage of the transistor 10 at room temperature is greater than 52 V. The excellent characteristics may be attributed to the employment of n$^+$-GaAs/p$^+$-$Ga_{0.51}In_{0.49}P$/n-GaAs high barrier gate and GaAs/$In_{0.15}Ga_{0.85}As$/GaAs quantum well structure to effectively confine electrons in the channel. Therefore, leakage current, breakdown voltage, and high temperature characteristics are all improved.

Figure 4:
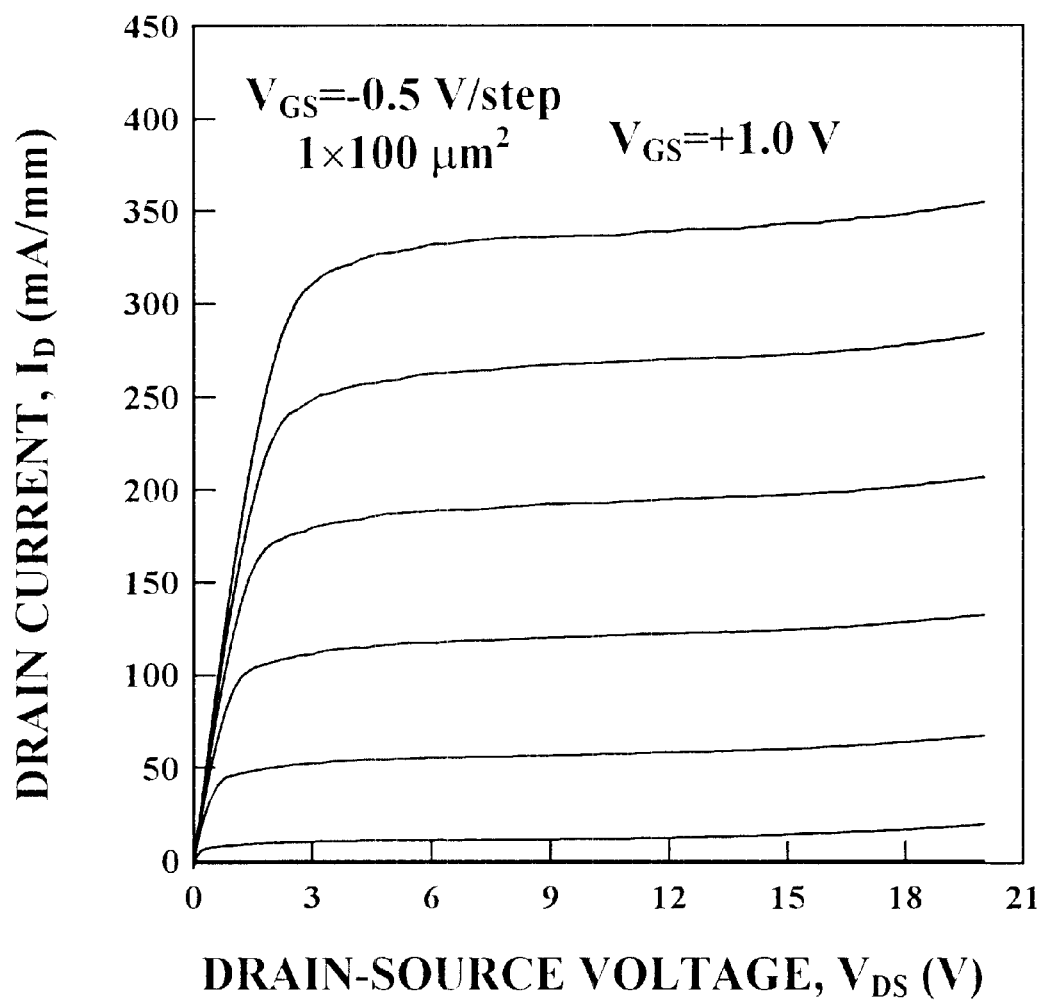
FIG. 4 shows the three-terminal common-source current-voltage characteristics of the high-breakdown voltage heterostructure field-effect transistor shown in FIG. 1.

FIG. 4 shows the common-source I–V characteristics of the transistor 10 at room temperature. The gate dimension is 1×100 μm$^2$. The applied gate-source voltage ($V_{GS}$) is –0.5 V/step and the maximum $V_{GS}$ voltage is +1.0 V. It is clear from FIG. 4 that the device shows good pinch-off behaviors and large output voltage operation regime (>20 V). The measured threshold voltage, $V_{th}$, is about –1.9 V. The drain leakage current is only of 550 μA/mm at $V_{DS}$=20 V and $V_{GS}$=–2.0 V. Furthermore, the saturation region is larger than 16V (4 V≦drain-source voltage, $V_{DS}$≦20 V). The excellent performance of this device makes it very suitable for high-power integrated circuit applications.

Figure 5:
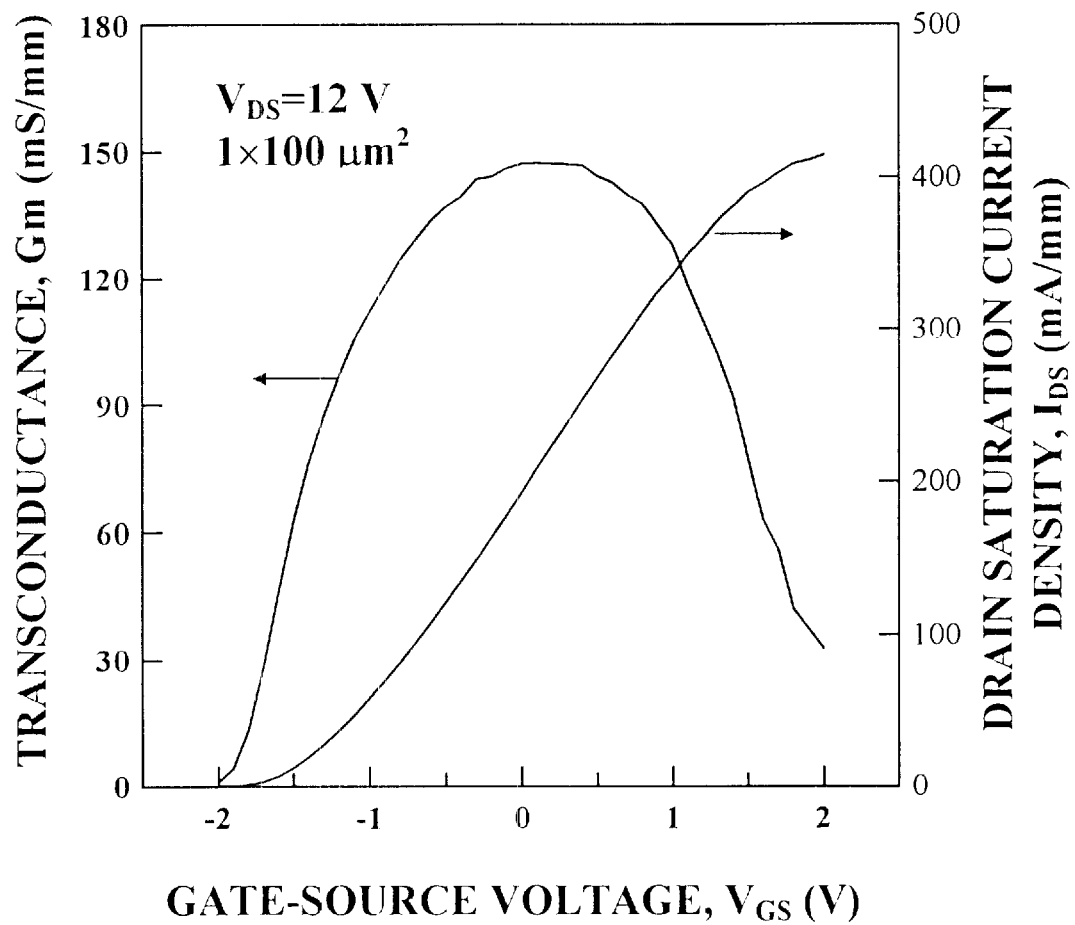
FIG. 5 shows the drain saturation current density ($I_{DS}$) and transconductance as a function of gate biased voltage of the high-breakdown voltage heterostructure field-effect transistor shown in FIG. 1, when the drain-source voltage is fixed at 12 V.

FIG. 5 shows the drain saturation current density ($I_{DS}$) and transconductance ($G_m$) as a function of gate biased voltage (gate-source voltage, $V_{GS}$) of the transistor 10, when the drain-source voltage ($V_{DS}$) is fixed at 12 V. The gate dimension is 1×100 μm$^2$. It can be seen from FIG. 5 that the maximum $I_{DS,max}$=410 mA/mm and the maximum transconductance $G_{m,max}$=147 mS/mm are obtained. In addition, the width of flat drain current density, defined as the drop of 10% from the $G_{m,max}$, is 225 mA/mm.

FIG. 6 shows the three-terminal off-state drain-gate ($V_{DG}$), drain-source ($V_{DS}$) voltages, and gate current density ($I_G$) as a function of gate biased voltage (gate-source voltage, $V_{GS}$) measured by drain current injection model at room temperature. The injection drain current ($I_D$) is fixed at 1 mA/mm. The breakdown voltages of drain-source, $BV_{DS}$, and drain-gate, $BV_{DG}$, are defined at the peak of $V_{DS}$ curve and the extraction of the point at $I_G$=–1 mA/mm, respectively. It is known that, from FIG. 6, $BV_{DS}$=39.7 V and $BV_{DG}$=43.4 V are obtained at $I_D$=1 mA/mm. Due to the high off-state breakdown voltage, the voltage swing of logic circuit and power density of amplifiers will be increased when the device of the present invention is used.

FIG. 7 shows the three-terminal off-state $BV_{DS}$ and $BV_{DG}$ as a function of temperature at the injection drain current of $I_D$=1 mA/mm. The $BV_{DS}$ and $BV_{DG}$ show the negative temperature coefficients. The drain-gate breakdown voltage ($BV_{DG}$) values are 43.4, 40, 38.5, 36.8, 34.6, 31.2, and 29.4 V at the temperatures of 300, 330, 360, 390, 420, 450, and 480 K, respectively. Further, the corresponding drain-source breakdown voltage ($BV_{DS}$) values are 39.7, 36.2, 35, 33.2, 32.1, 28.3, and 21.5 V, respectively. The experimental results show that the ability of high-temperature endurance of the device of the present is indeed fine, and thus demonstrate that the structure of the device of the present invention is suitable for integrated circuit applications in a long-time high-temperature environment. It is worthy to note that at 480 K the $BV_{DG}$ and $BV_{DS}$ values are still up to 29.4 and 21.48 V, respectively.

In addition to the high-breakdown voltage and high temperature operation ability shown above, the heterostricture field-effect transistor of the present invention has a superior high-temperature performance in comparison with the prior art heterostructure field-effect transistors. The following table lists gate leakage currents of the heterostructure field-effect transistors disclosed in the present invention and two prior art references at high temperatures:

| | Gate leakage current | | |
|---|---|---|---|
| Temperature | This invention @ 40 V | Prior art[1] @ 20 V | Prior art[2] @ 30 V |
| 300 K. | 37 µA/mm | 39 µA/mm | 260 µA/mm |
| 330 K. | 41 µA/mm | 162 µA/mm | 490 µA/mm |
| 360 K. | 51 µA/mm | 460 µA/mm | 620 µA/mm |
| 390 K. | 430 µA/mm | 1.58 mA/mm | 830 µA/mm |
| 420 K. | 720 µA/mm | 2.75 mA/mm | 1 mA/mm |
| 450 K. | 1.8 mA/mm | | 1.4 mA/mm |
| 480 K. | 3.5 mA/mm | | |

[1] J. S. Su, W. C. Hsu, W. Lin, and S. Y. Jain, "High-Breakdown Characteristics of the InP-Based Heterostructure Field-Effect Transistor with $In_{0.34}Al_{0.66}As_{0.85}Sb_{0.15}$ Schottky Layer," IEEE Electron Device Letters, Vol. 19, No. 6, pp. 195–197, June 1998.
[2] W. L. Chang, H. J. Pan, W. C. Wang, K. B. Thei, S. Y. Cheng, W. S. Lour, and W. C. Liu, "Temperature-Dependent Characteristics of the Inverted Delta-Doped V-Shaped $InGaP/In_xGa_{1-x}As/GaAs$ Pseudomorphic Transistors," Jpn. J. Appl. Phys., Vol. 38, pp. L1385–L1387, part 2, No. 12A, December 1, 1999.

Although the present invention has been described with reference to specific details of certain embodiments thereof, it is not intended that such details should be regarded as limitations upon the scope of the invention except as and to the extent that they are included in the accompanying claims. Many modifications and variations are possible in light of the above disclosure.

What is claimed is:

1. A high-breakdown voltage heterostructure field-effect transistor comprising:
   a semiconductor substrate;
   an undoped buffer layer formed on said substrate;
   an n-type delta-doped sheet formed on said undoped buffer layer;
   an undoped layer formed on said n-type delta-doped sheet;
   an undoped sub-channel layer formed on said undoped layer;
   an n-type active channel layer formed on said undoped sub-channel layer;
   a p-type gate layer formed on said n-type active channel layer; and
   an n-type ohmic contact layer formed on said p-type gate layer.

2. The transistor according to claim 1, wherein said substrate of the transistor of the present invention is a semi-insulating GaAs.

3. The transistor according to claim 2, wherein said undoped buffer layer is an undoped GaAs having a thickness of 0.1–2.0 µm.

4. The transistor according to claim 1, wherein said n-type delta-doped sheet has a doping concentration ranging from $2\times10^{12}$ to $1\times10^{13}$ cm$^{-3}$.

5. The transistor according to claim 3, wherein said undoped layer formed on said n-type delta-doped sheet is GaAs having a thickness of 50–100 Å.

6. The transistor according to claim 5, wherein said undoped sub-channel layer is undoped $In_xGa_{1-x}As$ having a thickness of 100–200 Å, where x=0.05–0.25.

7. The transistor according to claim 6, wherein said n-type active channel layer is n-type GaAs having a thickness of 1500–3000 Å and an n-type dopant concentration of n=$1\times10^{17}$–$5\times10^{17}$ cm$^{-3}$.

8. The transistor according to claim 7, wherein said p-type gate layer is p-type $Ga_{0.51}In_{0.49}P$ having a thickness of 80–120 Å and a p-type dopant concentration of p=$6\times10^{18}$–$1\times10^{19}$ cm$^{-3}$.

9. The transistor according to claim 7, wherein said p-type gate layer is p-type $Al_xGa_{1-x}As$ having a thickness of 80–120 Å and a p-type dopant concentration of p=$6\times10^{18}$–$1\times10^{19}$ cm$^{-3}$, where x=0.2–0.5.

10. The transistor according to claim 7, wherein said p-type gate layer is $Al_{0.5}In_{0.5}P$ having a thickness of 80–120 Å and a p-type dopant concentration of p=$6\times10^{18}$–$1\times10^{19}$ cm$^{-3}$.

11. The transistor according to claim 8, wherein said n-type ohmic contact layer is a n-type GaAs having a thickness of 200–3000 Å and a n-type dopant concentration of n=$1\times10^{18}$–$1\times10^{19}$ cm$^{-3}$.

12. The transistor according to claim 1 further comprising a gate electrode which forms an ohmic contact with said n-type ohmic contact layer.

13. The transistor according to claim 12, wherein said gate electrode metal is Au.

14. The transistor according to claim 1 further comprising a drain electrode and a source electrode formed on two exposed portions of said n-type active channel layer, each of which forms an ohmic contact with said n-type active channel layer.

15. The transistor according to claim 14, wherein said drain electrode and said source electrode are Au/Ga/Ni metal.

16. The transistor according to claim 1, wherein said substrate is a semi-insulating InP.

17. The transistor according to claim 16, wherein said undoped buffer layer is InP having a thickness of 0.1–2.0 µm.

18. The transistor according to claim 17, wherein said undoped layer formed on said n-type delta-doped sheet is InP having a thickness of 50–100 Å.

19. The transistor according to claim 18, wherein said undoped sub-channel layer is $In_xGa_{1-x}As$ having a thickness of 100–200 Å, where x=0.45–0.6.

20. The transistor according to claim 19, wherein said n-type active channel layer is n-type $In_{0.53}Ga_{0.47}As$ having a thickness of 1500–3000 Å and an n-type dopant concentration of n=$1\times10^{17}$–$5\times10^{17}$ cm$^{-3}$.

21. The transistor according to claim 20, wherein said p-type gate layer is p-type $Al_{0.48}In_{0.52}As$ having a thickness of 80–120 Å and a p-type dopant concentration of p=$6\times10^{18}$–$1\times10^{19}$ cm$^{-3}$.

22. The transistor according to claim 21, wherein said n-type ohmic contact layer is n-type $In_{0.53}Ga_{0.47}As$ having a thickness of 200–3000 Å and an n-type dopant concentration of n=$1\times10^{18}$–$1\times10^{19}$ cm$^{-3}$.

23. The transistor according to claim 22 further comprising a gate electrode which forms an ohmic contact with said n-type ohmic contact layer.

24. The transistor according to claim 23, wherein said gate electrode metal is Au.

25. The transistor according to claim 20 further comprising a drain electrode and a source electrode formed on two exposed portions of said n-type active channel layer, each of which forms an ohmic contact with said n-type active channel layer.

26. The transistor according to claim 25, wherein said drain electrode and said source electrode are Au/Ga/Ni metal.

* * * * *